(12) United States Patent
Parsa et al.

(10) Patent No.: US 7,701,754 B1
(45) Date of Patent: Apr. 20, 2010

(54) MULTI-STATE ELECTROMECHANICAL MEMORY CELL

(75) Inventors: Roozbeh Parsa, San Jose, CA (US); Trevor Niblock, Santa Clara, CA (US); Mark W. Poulter, Orinda, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 897 days.

(21) Appl. No.: 11/516,326

(22) Filed: Sep. 5, 2006

(51) Int. Cl.
*G11C 11/00* (2006.01)
(52) U.S. Cl. .................................. 365/151
(58) Field of Classification Search ............... 365/151, 365/244, 164; 257/415, 417, 418; 333/105, 333/262; 200/181
See application file for complete search history.

(56) References Cited

U.S. PATENT DOCUMENTS

| | | | |
|---|---|---|---|
| 5,677,823 A | 10/1997 | Smith | 361/234 |
| 6,160,230 A | 12/2000 | McMillan et al. | |
| 6,229,683 B1 | 5/2001 | Goodwin-Johansson | 361/233 |
| 6,300,149 B1 | 10/2001 | Smith | 438/15 |
| 6,410,360 B1 | 6/2002 | Steenberge | |
| 6,441,405 B1 | 8/2002 | Smith | 257/103 |
| 6,509,605 B1 | 1/2003 | Smith | 257/316 |
| 6,625,047 B2 * | 9/2003 | Coleman, Jr. | 365/51 |
| 2003/0183008 A1 | 10/2003 | Bang et al. | |
| 2004/0238907 A1 | 12/2004 | Pinkerton et al. | |
| 2006/0141678 A1 * | 6/2006 | Montgomery et al. | 438/129 |
| 2007/0235826 A1 * | 10/2007 | Jaiprakash et al. | 257/415 |
| 2007/0236307 A1 | 10/2007 | Liu | |

OTHER PUBLICATIONS

U.S. Appl. No. 11/516,432 to Roozbeh Parsa et al filed Sep. 5, 2006. See attached IDS Letter for relevance.
Micromachining, IEE Electronics Systems And Software, Aug./Sep. 2004, pp. 44-45.
Zengtao Liu, et al., "Novel Electrostatic Repulsion Forces In MEMS Applications by Nonvolatile Charge Injection", IEEE-Proc. MEMS, 2002, pp. 598-601.
Xi-Qing Sun, et al., "A Bistable Microrelay Based on Two-Segment Multimorph Cantilever Actuators", The Eleventh Annual International Workshop on Micro Electro Mechanical Systems, IEEE, 1998, MEMS 1998 Proceedings, pp. 154-159.
Richard H. Wolf and Arthur H. Heuer, "TiNi (Shape Memory) Films on Silicon for MEMS Applications", Journal of Microelectromechancal Systems, vol. 4, No. 4, Dec. 1995, pp. 206-212.
Benedetto Vigna, "More Than Moore: Micro-Machined Products Enable New Applications And Open New Markets", Electron Devices Meeting, 2005, IEDM Technical Digest, IEEE International, Dec. 5, 2005, pp. 1-8 (unnumbered).

(Continued)

*Primary Examiner*—Van Thu Nguyen
*Assistant Examiner*—Douglas King
(74) *Attorney, Agent, or Firm*—Mark C. Pickering

(57) ABSTRACT

An electromechanical memory cell utilizes a cantilever and a laterally positioned electrode. The cantilever is spaced apart from the electrode by a distance that is greater than the elastic limit of the cantilever. The memory cell is programmed by applying voltages to the cantilever and the electrode which causes the cantilever to move into a region of plastic deformation without ever touching the electrode.

5 Claims, 4 Drawing Sheets

OTHER PUBLICATIONS

Mike A. Beunder, et al., A New Embedded NVM Technology for Low-Power, High Temperature, Rad-Hard Applications, IEEE, Nov. 2005, pp. 65-68.

Nram, "The Principles of Operation", 2004, [online], [retrieved on Aug. 16, 2006]. Retrieved from the Internet: <URL:http://www.nantero.com/nram/html>, pp. 1.

Cavendish Kinetics, "Technology", 2005, [online], [retrieved on Aug. 16, 2006]. Retrieved from the Internet: <URL:http://www.cavendish-kinetics.com/index.php?option=com_content&task=view&id=105&Itemid=153>, pp. 1-2.

U.S. Appl. No. 11/516,432, filed Sep. 5, 2006, Parsa, et al.

* cited by examiner

MULTI-STATE ELECTROMECHANICAL MEMORY CELL

BACKGROUND OF THE INVENTION

1. Field of the Invention

The present invention relates to memory cells and, more particularly, to a multi-state electromechanical memory cell.

2. Description of the Related Art

Memory cells are embedded in most current-generation electronic devices, such as computers, cell phones, cameras, and games. The push and motivation in the memory industry is to shrink the size of the cells so that more cells can be packed in a given area, while maintaining the data retention and endurance attributes of the cells.

Memory cells are commonly classified as either volatile or non-volatile memory cells. A volatile memory cell stores data only as long as power is provided to the memory cell. A non-volatile memory cell, on the other hand, continues to retain data long after power has been removed from the memory cell.

Conventional non-volatile memory cells, such as EPROM, EEPROM, and FLASH cells, are transistor-based cells that utilize a floating gate to store data in the cell. The presence of a charge on the floating gate indicates a first logic state, while the absence of a charge on the floating gate indicates a second logic state.

Recently, non-volatile memory cells have been developed using micro-electromechanical (MEMS) technology. MEMS-based memories utilize the position of a mechanical member to store data in the memory cell. When the mechanical member is in a first position that is spaced away from an electrode, the memory cell exhibits a first electrical property that indicates a first logic state. On the other hand, when the mechanical member is in a second position that contacts the electrode, the memory cell exhibits a second electrical property that indicates a second logic state.

FIGS. 1A-1B show cross-sectional views that illustrate a prior-art MEMS-based memory cell 100. As shown in FIG. 1A, cell 100 includes a non-conductive region 110, and a first conductive strip 112 that contacts the top surface of non-conductive region 110. In addition, cell 100 includes a second conductive strip 114 that contacts the top surface of non-conductive region 110, and a conductive cantilever member 116 that contacts second conductive strip 114, and extends out over first conductive strip 112.

In operation, memory cell 100 is programmed by applying a program voltage to first conductive strip 112, and ground to cantilever member 116 via second conductive strip 114 (or visa versa). The difference between the program voltage and ground generates an electrostatic force that pulls the end section of cantilever member 116 down to contact conductive strip 112. Further, after the programming voltages have been removed, cantilever member 116 remains stuck to conductive strip 112 due to the surface adhesion forces between conductive strip 112 and the end section of cantilever member 116.

Memory cell 100 is read using a sense circuit that determines whether a voltage on conductive strip 112 is also present on cantilever member 116. Alternately, the sense circuit can read memory cell 100 by determining whether a current can flow from conductive strip 112 to cantilever member 116.

As shown in FIG. 1A, before being programmed, cantilever member 116 is in a first position that is spaced apart from conductive strip 112. In this position, the sense circuit determines that conductive strip 112 and cantilever member 116 have different voltages or, alternately, that a current can not flow from conductive strip 112 to cantilever member 116. As a result, the sense circuit indicates that memory cell 100 has not been programmed.

As shown in FIG. 1B, after being programmed, cantilever member 116 is in a second position that contacts conductive strip 112. In this position, the sense circuit determines that conductive strip 112 and cantilever member 116 have the same voltage or, alternately, that a current can flow from conductive strip 112 to cantilever member 116. As a result, the sense circuit indicates that memory cell 100 has been programmed.

One of the problems with memory cell 100 is that it is not possible to erase memory cell 100 so that cantilever member 116 is again spaced apart from conductive strip 112. If memory cell 100 can not be erased so that cantilever member 116 is again spaced apart from conductive strip 112, then memory cell 100 is limited to one-time programmable applications.

Memory cell 100 can be converted into a triple-state memory cell by the addition of an overlying conductive electrode that lies a distance vertically above cantilever 116. A triple-state memory cell has three possible states, depending on the position of a movable member (i.e., cantilever 116).

FIGS. 1AA-1CC show cross-sectional views that illustrate a prior-art triple-state memory cell 150. Triple-state memory cell 150 is similar to memory cell 100 and, as a result, utilizes the same reference numerals to designate the structures which are common to both memory cells. As shown in FIGS. 1AA-1CC, memory cell 150 differs from memory cell 100 in that memory cell 150 also has a structural member 152 and a third conductive strip 154 that contacts non-conductive region 110. In addition, memory cell 150 has a conductive via 156 that contacts conductive strip 154, and a conductive electrode 158 that contacts structural member 152 and conductive via 156 to lie above cantilever 116.

In triple-state memory cell 150, the first state is state 0 which corresponds with the initial position of cantilever 116 as shown in FIG. 1AA. The initial position of cantilever 116 is the position of cantilever 116 when no external force has yet been applied to cantilever 116 and memory cell 150 has never been programmed.

The second state is state +1 which corresponds with cantilever 116 being pulled down to contact conductive strip 112 as shown in FIG. 1BB. Cantilever 116 is pulled down from the initial position shown in FIG. 1AA to contact conductive strip 112 in the same manner as described above with respect to memory cell 100.

The third state is state −1 which corresponds with cantilever 116 being pulled up to contact conductive electrode 158 as shown in FIG. 1CC. Cantilever 116 is pulled up from the initial position shown in FIG. 1AA to contact conductive electrode 158 in the same manner that cantilever 116 is pulled down except that the program voltages are applied to cantilever 116 and conductive electrode 158 rather than conductive strip 112 and cantilever 116.

Cantilever 116 can also be moved from state +1 to state −1 or from state −1 to state +1. For example, to move cantilever 116 from state −1 to state +1, a reprogram voltage is applied to first conductive strip 112, while ground is applied to cantilever member 116 and conductive electrode 158. The difference between the reprogram voltage and ground generates an electrostatic force that pulls the end section of cantilever member 116 away from conductive electrode 158 down to contact conductive strip 112. After the reprogramming voltages have been removed, cantilever member 116 remains stuck to conductive strip 112 due to the surface adhesion forces.

One problem with moving cantilever 116 from one non-initial state to another non-initial state (i.e., state −1 to state +1) is that the required reprogram voltage is very high. Once cantilever 116 is in contact with conductive strip 112 or conductive electrode 158, the surface adhesion forces are quite strong.

Thus, the reprogram voltage must be substantially larger than the program voltage. As a result, the movement of cantilever 116 from one non-initial state to another non-initial state requires very high voltage circuitry which, in turn, increases the complexity of memory cell 150 and the fabrication process.

FIGS. 2A-2B show cross-sectional views that illustrate another prior-art MEMS-based memory cell 200. As shown in FIG. 2A, memory cell 200 includes a non-conductive region 210 that includes an opening, and a conductive member 212 that lies in the opening. As further shown in FIG. 2A, the top surface of conductive member 212 lies below the top surface of non-conductive region 210. In addition, cell 200 includes a conductive strip 214 that contacts the top surface of non-conductive region 210, and extends over conductive member 212.

In operation, memory cell 200 is programmed in the same way that memory cell 100 is programmed. With memory cell 200, a program voltage is applied to conductive member 212, and ground is applied to conductive strip 214 (or visa versa). In this case, the difference between the program voltage and ground generates an electrostatic force that pulls the center section of conductive strip 214 down to contact conductive member 212. Further, after the programming voltages have been removed, conductive strip 214 remains stuck to conductive region 212 due to the surface adhesion forces between conductive region 212 and the center section of conductive strip 214.

Memory cell 200 is also read in the same way that memory cell 100 is read. In this case, a sense circuit determines whether a voltage on conductive member 212 is also present on strip 214. Alternately, the sense circuit can read memory cell 200 by determining whether a current can flow from conductive member 212 to conductive strip 214.

As shown in FIG. 2A, before being programmed, conductive strip 214 is in a first position that is spaced apart from conductive member 212. In this position, the sense circuit determines that conductive member 212 and conductive strip 214 have different voltages or, alternately, that a current can not flow from conductive member 212 to conductive strip 214. As a result, the sense circuit indicates that memory cell 200 has not been programmed.

As shown in FIG. 2B, after being programmed, conductive strip 214 is in a second position that contacts conductive member 212. In this position, the sense circuit determines that conductive member 212 and conductive strip 214 have the same voltage or, alternately, that a current can flow from conductive member 212 to conductive strip 214. As a result, the sense circuit indicates that memory cell 200 has been programmed.

However, like memory cell 100, once programmed, it is not possible to erase memory cell 200 so that conductive strip 214 is again spaced apart from conductive region 212. If memory cell 200 can not be erased so that conductive strip 214 is again spaced apart from conductive member 212, then memory cell 200 is limited to one-time programmable applications.

In addition, like memory cell 100, memory cell 200 can be converted into a triple-state memory cell by the addition of an overlying conductive electrode that lies a distance vertically above conductive strip 214 of memory cell 200. However, a triple-state version of memory cell 200 suffers from the same drawbacks as memory cell 150, namely that a very high reprogram voltage is required to move conductive strip 214 from one non-initial state to another non-initial state (i.e., state +1 to state −1).

One common application of one-time programmable memory cells is to trim a device or circuit to adjust the electrical characteristics of the device or circuit to have a very precise value, often to match the electrical characteristics of another device or circuit. One-time programmable memory cells, however, provide no flexibility.

Thus, in situations where devices or circuits must be individually characterized, conventional memory cells must often be used to identify the trim that provides the most precise value. However, unlike MEMS devices, which are typically formed on the top surface of the interconnect structure, conventional memory cells are fabricated on the silicon surface and, therefore, consume valuable silicon real estate. As a result, there is a need for an electromechanical memory cell which can be programmed more than one time.

BRIEF DESCRIPTION OF THE DRAWINGS

FIGS. 1AA-1CC are cross-sectional views illustrating a prior-art triple-state memory cell 150.

FIG. 3A shows a plan view. FIG. 3B shows a cross-sectional view taken along line 3B-3B of FIG. 3A. FIG. 3C shows a cross-sectional view taken along line 3C-3C of FIG. 3A.

FIGS. 6A-8A are plan views. FIGS. 6B-8B are cross-sectional views taken along lines 6B-6B through 8B-8B of FIGS. 6A-8A. FIGS. 6C-8C are cross-sectional views taken along lines 6C-6C through 8C-8C of FIGS. 6A-8A.

DETAILED DESCRIPTION OF THE INVENTION

Figure 1A:
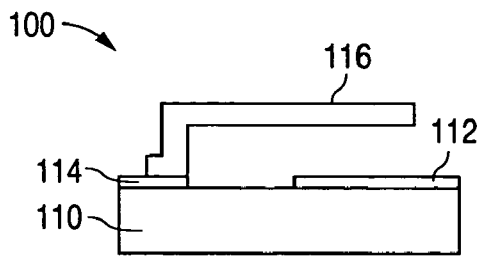
FIGS. 1A-1B are cross-sectional views illustrating a prior-art MEMS-based memory cell 100.
Figure 1A:
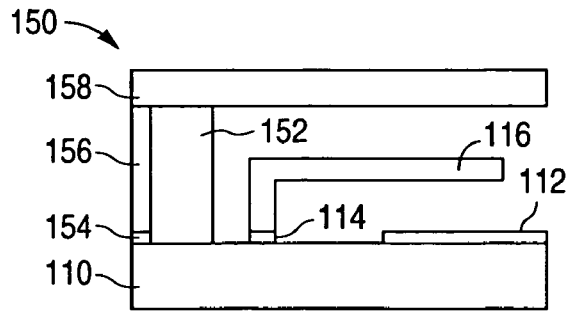
Figure 1B:
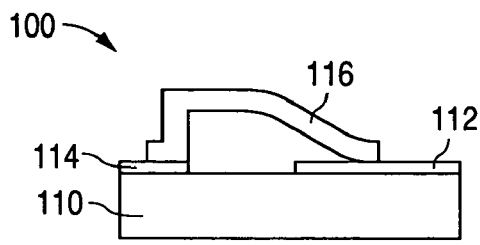
Figure 1B:
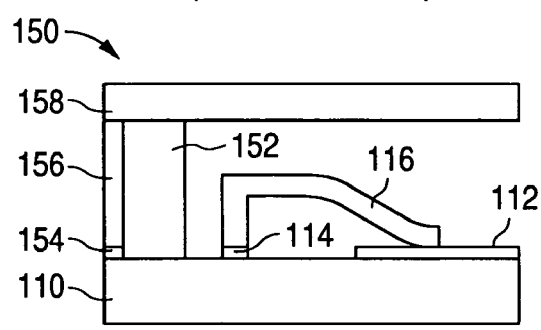
Figure 1C:
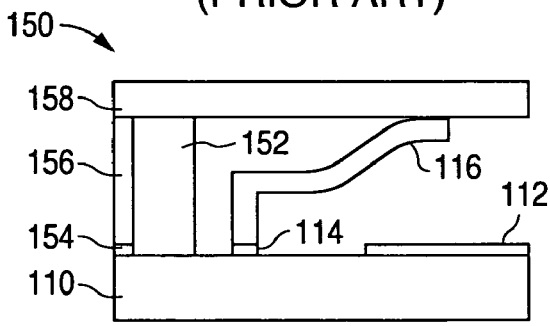
Figure 2A:
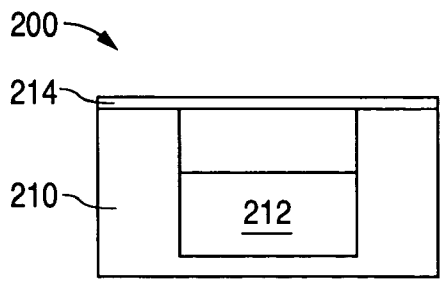
FIGS. 2A-2B are cross-sectional views illustrating a prior-art MEMS-based memory cell 200.
Figure 2B:
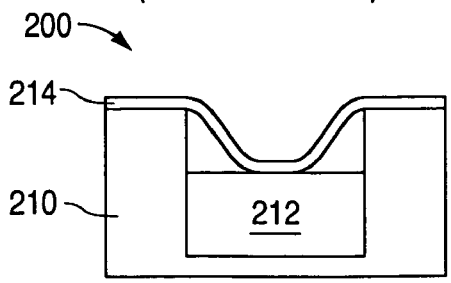
Figure 3A:
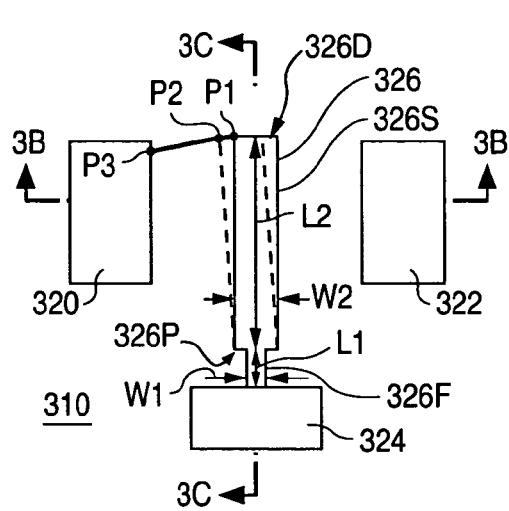
FIGS. 3A-3C are views illustrating an example of an electromechanical memory cell 300 in accordance with the present invention.
Figure 3B:
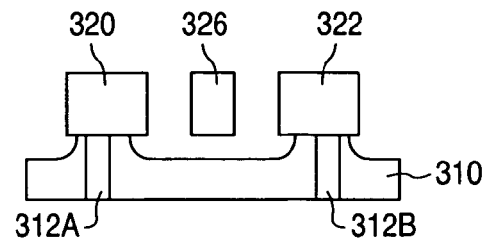
Figure 3C:
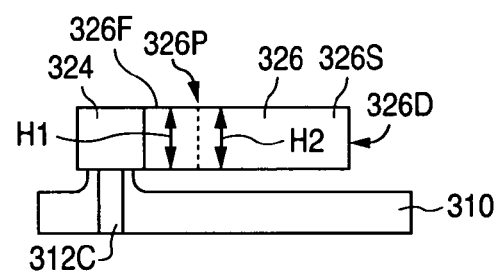

FIGS. 3A-3C show views that illustrate an example of a multi-state electromechanical memory cell 300 in accordance with the present invention. As described in greater detail below, the memory cell of the present invention utilizes a cantilever and a laterally positioned electrode to deform the cantilever past the elastic limit of the cantilever to thereby assume one of a number of fixed positions that is spaced apart from the electrode.

As shown in FIGS. 3A-3C, memory cell 300 includes a layer of isolation material 310, and a number of vertically conductive members that extend through isolation layer 310. The vertically conductive members, which are spaced apart from each other, include members 312A, 312B, and 312C. The bottom surface of each vertically conductive member 312A, 312B, and 312C is electrically connected to other semiconductor devices that allow memory cell 300 to be programmed more than one time.

As further shown in FIGS. 3A-3C, memory cell 300 includes a first electrode 320 and a second electrode 322. First electrode 320 contacts the top surface of isolation layer 310 to make an electrical connection with vertical conductive member 312A. Second electrode 322 contacts the top surface of isolation layer 310 to make an electrical connection with vertical conductive member 312B.

In addition, memory cell 300 includes a third electrode 324 that contacts the top surface of isolation layer 310 to make an electrical connection with vertical conductive member 312C. Further, memory cell 300 includes a conductive cantilever 326 that extends away from third electrode 324. Cantilever 326 is spaced apart from isolation layer 310 to be laterally movable towards and away from first electrode 320, and laterally movable towards and away from second electrode 322.

Cantilever 326 has a first section 326F and a second section 326S. First section 326F has a height H1, length L1, and width W1. Second section 326S has a proximate end 326P that contacts first section 326F, and a distal end 326D that is spaced apart from first section 326F. In addition, second section 326S has a height H2 equal to the height H1 of first section 326F, a length L2 that is substantially greater to the length L1 of first section 326F, and a width W2 that is greater than the width W1 of first section 326F. Alternately, the height H1 of first section 326F can be less than or greater than the height H2 of second section 326S.

FIG. 3A shows cantilever 326 with an initial shape in an initial position, and a dashed representation of cantilever 326 with a deformed shape in an elastic limit position. Cantilever 326 has an elastic range of motion and a plastic range of motion. The elastic limit position defines the elastic limit of cantilever 326 such that any additional deformation towards first electrode 320 causes cantilever 326 to enter the plastic range of motion.

When an external bending force is applied to cantilever 326 and cantilever 326 remains within the elastic range of motion, cantilever 326 returns to the initial position after the external bending force has been removed (unless some other force is present). When the external bending force causes cantilever 326 to exceed the elastic limit of cantilever 326 and enter the plastic range of motion, cantilever 326 does not return to the initial position after the external bending force has been removed. Instead, cantilever 326 retains a deformed shape until another external force changes its position.

Thus, an elastic distance can be defined to be a distance measured along a line from a point P1 on cantilever 326 when cantilever 326 is at the initial position to a position P2 that corresponds with the point P1 on cantilever 326 when cantilever 326 is at the elastic limit of cantilever 326. In addition, an initial distance can be defined to be a distance measured along the line from the point P1 on cantilever 326 when cantilever 326 is at the initial position to a point P3 on first electrode 320.

In accordance with the present invention, the initial distance is greater than the elastic distance. Cantilever 326 can be formed from any material, but preferably from a material that has a relatively small elastic range of motion and relatively large plastic range of motion. Any motion which exceeds the plastic limit of cantilever 326 causes cantilever 326 to break, and repeated motion within the plastic range of motion leads to fatigue.

In operation, memory cell 300 has three, five, seven, or more possible states, depending on the position of cantilever 326 and the sensitivity of the read circuitry. The first state is state 0 which corresponds with the initial position of cantilever 326 as shown in FIG. 3A. The initial position of cantilever 326 is the position of cantilever 326 when no external force has yet been applied to cantilever 326 and memory cell 300 has never been programmed.

The second state is state +1 which corresponds with a first deformed position of cantilever 326, while the third state is state −1 which corresponds with a second deformed position of cantilever 326. If five states are utilized, the fourth state is state +2 which corresponds with a third deformed position of cantilever 326, while the fifth state is state −2 which corresponds with a fourth deformed position of cantilever 326.

To place memory cell 300 in state +1, +2, or another "+" state, a positive voltage is applied to first electrode 320 via member 312A, ground is applied to second electrode 322 via member 312B, and ground is applied to cantilever 326 via third electrode 324 and member 312C.

The voltage difference generates an electrostatic force that laterally pulls cantilever 326 towards first electrode 320 past the elastic limit of cantilever 326. After a programming period has expired, the voltages are removed. Since the electrostatic force pulled cantilever 326 past the elastic limit, cantilever 326 remains in a deformed position as a result of the plastic deformation of cantilever 326. Therefore, memory cell 300 functions as a non-volatile memory.

Figure 4:
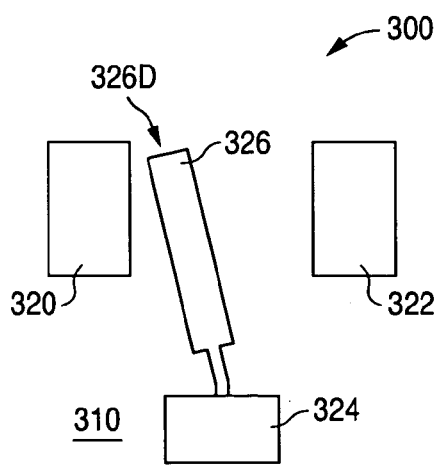
FIG. 4 is a plan view of memory cell 300 illustrating an example of memory cell 300 in state +1 in accordance with the present invention.

FIG. 4 shows a plan view of memory cell 300 that illustrates an example of memory cell 300 in state +1 in accordance with the present invention. As shown in FIG. 4, memory cell 300 is in state +1, which corresponds with the first deformed position of cantilever 326, when the distal end 326D of cantilever 326 is spaced apart from first electrode 320 by a first distance.

In accordance with the present invention, no portion of cantilever 326 ever contacts first electrode 320. This is because the voltage that would be required to detach cantilever 326 from first electrode 320 (a requirement to have a multi-time programmable device) is impracticably high due to the surface adhesion forces between cantilever 326 and first electrode 320.

In addition, when the distal end 326D of cantilever 326 is in state +1 or the first deformed position, the distal end 326D remains more than a "jump distance" away from first electrode 320. When the separation distance between two conductors is less than the jump distance, the surface attraction forces pull the two conductors together even in the absence of externally applied voltages that generate an electrostatic force.

The distance traveled by the distal end 326D of cantilever 326 is a function of the voltage applied to first electrode 320, the material used to form cantilever 326, and the programming period. To place memory cell 300 in state +2, which corresponds with the third deformed position of cantilever 326, from the never-been-programmed state 0, the same process is followed except that different programming conditions are used, e.g., a different positive voltage is applied to first electrode 320 via member 312A, and/or a different programming period is used.

In response to the different programming conditions, the distal end 326D of cantilever 326 is laterally pulled a different distance toward first electrode 320 past the elastic limit of cantilever 326. After the different programming conditions are then removed, cantilever 326 remains in a different deformed position that corresponds with state +2 or the third deformed position.

Figure 5:
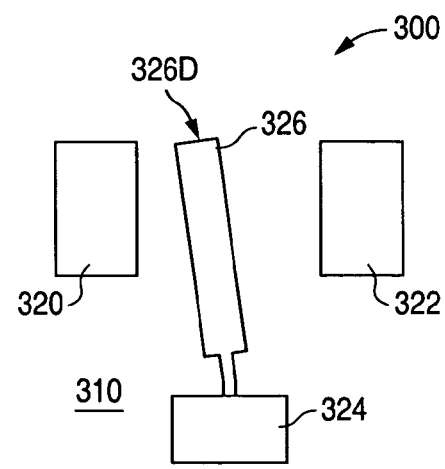
FIG. 5 is a plan view of memory cell 300 illustrating an example of memory cell 300 in state +2 in accordance with the present invention.

FIG. 5 shows a plan view of memory cell 300 that illustrates an example of memory cell 300 in state +2 in accordance with the present invention. As shown in FIG. 5, memory cell 300 is in state +2 or the third deformed position when the distal end 326D lies a second distance from first electrode 320. The second distance, in turn, is greater than the first distance. Cantilever 326 can be placed in any other "+" state by using different programming conditions that pull cantilever 326 past the elastic limit of cantilever 326.

In addition, cantilever 326 is placed in any of the "−" states from the never-been-programmed state in the same manner that cantilever 326 is placed in a "+" state, except that the positive voltage is applied to second electrode 322, while ground is applied to first electrode 320 and cantilever 326. As above, after placing cantilever 326 in state −1 or the second deformed position, the distal end 326D of cantilever 326 is spaced the first distance away from second electrode 322. As above, no portion of cantilever 326 ever contacts second electrode 322.

To move from state +1 to state −1 (or from state "+1" to any other "+" state further away from first electrode 320 or any "−" state), a positive voltage is applied to second electrode 322, while ground is applied to first electrode 320 and cantilever 326. The programming conditions (applied voltage and programming period) depend on which new state is to be assumed.

Similarly, to move from state −1 to state +1 (or from state "−1" to any other "−" state further away from second electrode 322 or any "+" state), a positive voltage is applied to first electrode 320, while ground is applied to second electrode 322 and cantilever 326. The programming conditions (applied voltage and programming period) depend on which new state is to be assumed. Thus, to move from any state to any other state, the positive voltage is placed on the electrode (320 or 322) that corresponds with the direction of movement.

Alternately, in addition to using an attractive electrostatic force to deform cantilever 326, a repulsive electrostatic force can also be used. For example, to move from state +1 to state −1, positive voltages can be applied to both first electrode 320 and cantilever 326 while ground is applied to second electrode 322.

Memory cell 300 is read using a conventional sense circuit, such as a bridge circuit, that measures the capacitance between first electrode 320 and cantilever 326. The capacitance between two objects varies as the distance between the two objects varies. In addition, the sense circuit can also measure the capacitance between second electrode 320 and cantilever 326, and then compare the two capacitance measurements to determine a measured capacitance value.

The state held by memory cell 300 is then determined from the measured capacitance value. For example, state +1 can correspond with a measured capacitance value that falls within a first range of measured capacitance values, while state +2 can correspond with a measured capacitance value that falls within a second range of measured capacitance values.

Thus, in accordance with the present invention, an electromechanical memory cell has been described that is non-volatile and more than one-time programmable. Cell 300 is expected to be programmable 5, 10, or more times, and does not require any silicon real estate.

In addition to being more than one-time programmable, the memory cell of the present invention can be programmed to hold multiple states. Thus, where a conventional memory cell can hold only two logic states (a logic low or a logic high), the memory cell of the present invention can hold two, four, or more logic states, thereby reducing the number of memory cells that are required by a circuit.

FIGS. 6A-6C through 8A-8C show views that illustrate an example of a method 600 of forming an electromechanical memory cell in accordance with the present invention. FIGS. 6A-8A show plan views. FIGS. 6B-8B show cross-sectional views taken along lines 6B-6B through 8B-8B of FIGS. 6A-8A. FIGS. 6C-8C show cross-sectional views taken along lines 6C-6C through 8C-8C of FIGS. 6A-8A.

Figure 6A:
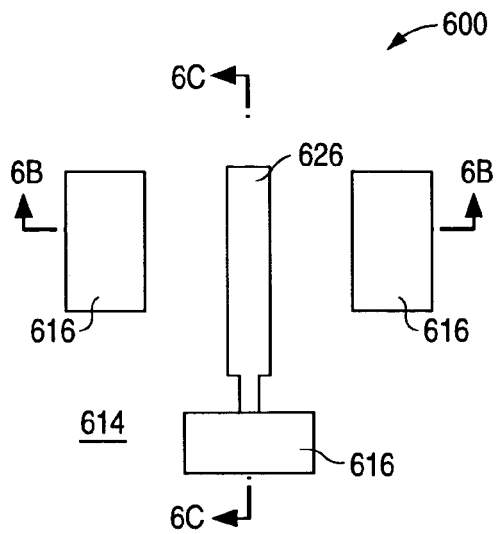
FIGS. 6A-6C through 8A-8C are views illustrating an example of a method 600 of forming an electromechanical memory cell in accordance with the present invention.
Figure 6B:
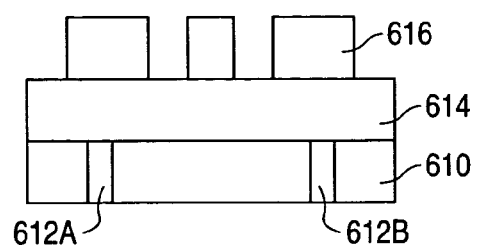
Figure 6C:
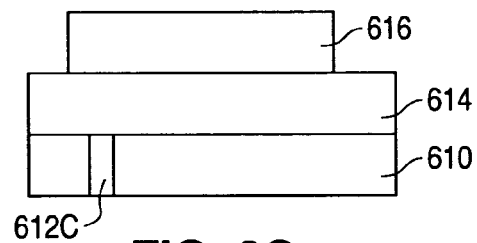

As shown in FIGS. 6A-6C, method 600 begins following the conventional formation of a layer of isolation material 610, and a number of vertically conductive members that extend through isolation layer 610. In the present example, the vertically conductive members, which can be implemented with conventionally-formed intermetal via structures, include spaced-apart members 612A, 612B, and 612C.

After isolation layer 610 and members 612 have been formed, a conductor 614, such as aluminum or copper, is formed over the top surfaces of isolation layer 610 and members 612 using conventional processes to make an electrical connection with members 612A, 612B, and 612C.

Figure 7A:
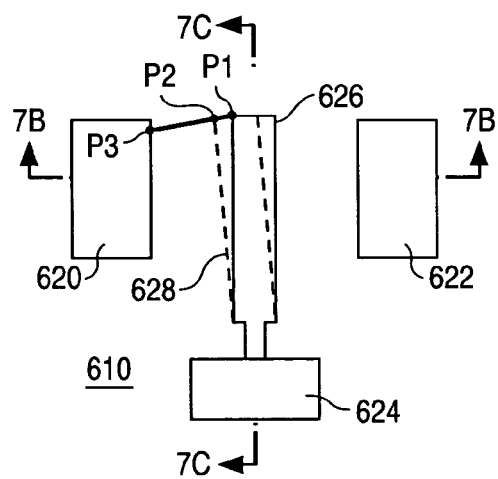
Figure 7B:
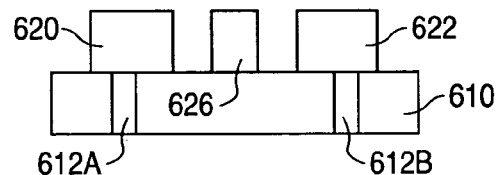
Figure 7C:
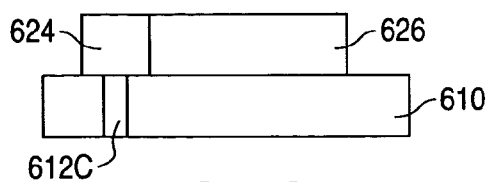

Next, a mask 616 is formed and patterned on the top surface of conductor 614. Following this, the exposed regions of conductor 614 are etched until the exposed regions of conductor 614 have been removed. Mask 616 is then removed. As shown in FIGS. 7A-7C, the etch forms a first electrode 620, a second electrode 622, a third electrode 624, and a notched cantilever structure 626.

FIG. 7A shows cantilever structure 626 with an initial shape in an initial position, and a dashed representation of a cantilever 628 which is to be formed from cantilever structure 626. Cantilever 628 is illustrated with a deformed shape in the elastic limit position. Thus, an elastic distance is a distance measured along a line from a point P1 on cantilever structure 626 to a position P2 that corresponds with the point P1 on cantilever 628 when cantilever 628 is in a position that represents an elastic limit of cantilever 628. In addition, an initial distance is a distance measured along the line from the point P1 on cantilever structure 626 to a point P3 on first electrode 620.

Figure 8A:
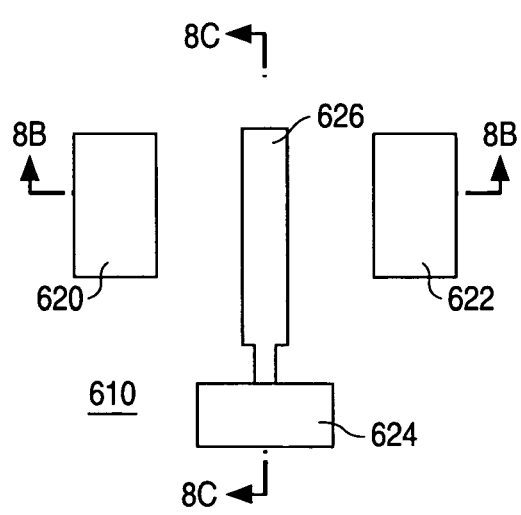
Figure 8B:
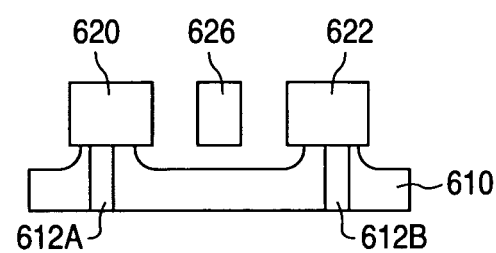
Figure 8C:
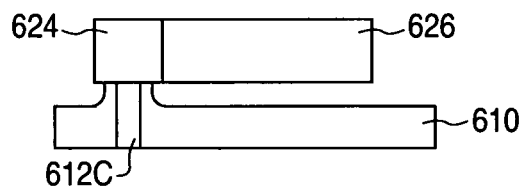

After this, as shown in FIGS. 8A-8C, isolation layer 610 is etched. The etch removes the portion of isolation layer 610 that lies between first electrode 620, second electrode 622, third electrode 624, and cantilever structure 626. In addition, the etch removes the portion of isolation layer 610 that lies under the edges of first electrode 620, second electrode 622, and third electrode 624.

Further, the etch removes the portion of isolation layer 610 that lies below cantilever structure 626. The removal of this portion of isolation layer 610 frees cantilever structure 626 to move laterally between the first and second electrodes 620 and 622. Following this, method 600 continues with conventional back end processing steps.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A memory cell comprising:
   an isolation layer;
   a first electrode that contacts the isolation layer;
   a second electrode that contacts the isolation layer, the first and second electrodes being spaced apart; and
   a cantilever that contacts the second electrode, the cantilever being movable towards and away from the first electrode, and spaced apart from the isolation layer and the first electrode, the cantilever having an initial shape and an initial position, an elastic distance being a distance measured along a line from a point on the cantilever when the cantilever is at the initial position to a position that corresponds with the point on the cantilever when the cantilever is at an elastic limit of the cantilever, an initial distance being a distance measured along the line from the point on the cantilever when the cantilever is at the initial position to a point on the first electrode, the initial distance being greater than the elastic distance.

2. The memory cell of claim 1 wherein the cantilever has a first section and a second section, the second section having a height, a length that is substantially greater than a length of the first section, and a width that is greater than a width of the first section.

3. The memory cell of claim 2 wherein the first electrode, the second electrode, and the cantilever lie within a common horizontal plane.

4. The memory cell of claim 1 and further comprising a third electrode that contacts the isolation material, the cantilever lying between the first and third electrodes in the initial position, and being movable towards and away from the third electrode, the first, second, and third electrodes being spaced apart.

5. The memory cell of claim 4 wherein the first electrode, the second electrode, the third electrode, and the cantilever lie within a common horizontal plane.

\* \* \* \* \*